US008248166B2

(12) United States Patent
Kobayashi

(10) Patent No.: US 8,248,166 B2
(45) Date of Patent: Aug. 21, 2012

(54) TRIPLET TRANSCONDUCTOR

(75) Inventor: Kevin W. Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/074,051

(22) Filed: Mar. 29, 2011

(65) Prior Publication Data

US 2011/0316635 A1    Dec. 29, 2011

Related U.S. Application Data

(60) Provisional application No. 61/358,116, filed on Jun. 24, 2010.

(51) Int. Cl.
*H03F 3/04* (2006.01)
(52) U.S. Cl. .................... 330/311; 330/310
(58) Field of Classification Search .......... 330/311, 330/310, 150, 98
See application file for complete search history.

(56) References Cited

U.S. PATENT DOCUMENTS

| 3,121,201 | A | * | 2/1964 | Bernstein-Bervery et al. ... 330/3 |
| 3,383,615 | A | * | 5/1968 | Milberger et al. ............ 330/306 |
| 3,414,831 | A | * | 12/1968 | Wilson ........................ 330/260 |
| 6,727,762 | B1 | | 4/2004 | Kobayashi |
| 6,806,778 | B1 | | 10/2004 | Kobayashi |
| 6,927,634 | B1 | | 8/2005 | Kobayashi |
| 6,933,787 | B1 | | 8/2005 | Kobayashi |
| 6,972,630 | B2 | | 12/2005 | Kobayashi |
| 7,619,482 | B1 | * | 11/2009 | Kobayashi ................... 330/311 |

OTHER PUBLICATIONS

Armijo, C.T. et et al., "A New Wide-Band Darlington Amplifier," IEEE Journal of Stolid-State Circuits, Aug. 1989, pp. 1105-1109, vol. 24, No. 4, IEEE.
Kobayashi, K.W., "High Linearity-Wideband PHEMT Darlington Amplifier with +40 dBm IP3," 2006 Asia-Pacific Microwave Conference, Dec. 12-15, 2006, pp. 1035-1038, IEEE.
Kobayashi, K.W., "Improved efficiency, IP3-bandwidth and robustness of a microwave Darlington amplifier using 0.5μm ED PHEMT and a new circuit topology," 2005 IEEE Compound Semiconductor Integrated Circuit Symposium, Oct. 30-Nov. 2, 2005, pp. 93-96, IEEE.
Kobayashi, K.W., "A Novel E-mode PHEMT Linearized Darlington Cascode Amplifier," 2006 IEEE Compound Semiconductor Integrated Circuit Symposium, Nov. 2006, pp. 153-156, IEEE.
Sirenza Microdevices, "Standard 5 V Medium Power InGaP Darlington Amplifiers," Microwave Journal, Apr. 2005, p. 164, vol. 48, No. 5, Horizon House Publications, Inc.

* cited by examiner

*Primary Examiner* — Henry Choe
(74) *Attorney, Agent, or Firm* — Withrow & Terranova, P.L.L.C.

(57) ABSTRACT

To reduce a knee voltage of a Darlington amplifier, a negative voltage is applied by a depletion mode FET between the emitter of one amplifying transistor and the base of another amplifying transistor to provide a reduced potential, which reduces the knee voltage of the Darlington amplifier. Reducing the knee voltage of the Darlington amplifier decreases the size of a saturation region thereby increasing the linearity of the Darlington amplifier.

20 Claims, 10 Drawing Sheets

US 8,248,166 B2

TRIPLET TRANSCONDUCTOR

This application claims the benefit of U.S. provisional patent application No. 61/358,116, filed Jun. 24, 2010, the disclosure of which is incorporated herein by reference in its entirety.

FIELD OF THE DISCLOSURE

The present disclosure is directed to a triplet transconductor and particularly to a triplet transconductor that may be utilized as a Darlington amplifier.

BACKGROUND OF THE DISCLOSURE

Darlington amplifiers are configured to increase amplification by using the gain of multiple transistors to amplify an input signal. FIG. 1 illustrates one configuration of a prior art Darlington amplifier 10. One prior art Darlington amplifier 10 includes a pair of transistors (referred to generically as elements 12 and specifically to a particular transistor as elements $Q_1$-$Q_2$) and consequently is often referred to as a Darlington pair. In the Darlington amplifier 10, an input signal 14 is received at an input terminal 16 and, in response, the Darlington amplifier 10 compounds the gain of each of the transistors 12 to generate an amplified output signal 18, which is transmitted through an output terminal 20. In the illustrated Darlington amplifier 10, the transistors 12 are bipolar junction transistors (BJTs), which have been built on a silicon type semiconductor substrate (not shown), and each has a base, B, a collector, C, and an emitter, E. Upon receiving the input signal 14 at the base, B, of the first amplifying transistor ($Q_1$), the first amplifying transistor ($Q_1$), amplifies the input signal 14 and generates a first collector current 22 (or $I_{C1}$) from the collector, C. The emitter, E, of the first transistor, ($Q_1$), is connected to the base, B of the second amplifying transistor ($Q_2$) and, in response to the input signal 14, the second amplifying transistor ($Q_2$), also amplifies the input signal 14 to generate a second collector current 24 (or $I_{C2}$) from its collector, C. Since the collectors, C, of each of the transistors 12 are connected to one another and to the output terminal 20, each of the transistors 12 amplify the input signal 14 to generate the amplified output signal 18, which is a combination of the first collector current 22 and the second collector current 24.

While the Darlington amplifier 10 has the advantage of compounding the gain of each transistor 12 to substantially increase the gain of amplification, the topology of the Darlington amplifier 10 increases the voltage that must be presented by the amplified output signal 18 at the collectors, C, of the first transistor, ($Q_1$), and the second amplifying transistor ($Q_2$) so that the Darlington amplifier reaches a knee voltage, $V_{knee}$ and operates in an activation region. This is caused by the base-emitter voltage, $V_{BE2}$, of the second amplifying transistor ($Q_2$) presenting a positive voltage at the emitter, E, of the first amplifying transistor ($Q_1$).

Referring now to FIGS. 1 and 2, a graph illustrating the total Darlington collector current, Ice_total=$I_{C1}$+$I_{C2}$, of the combined or total Darlington pair (the first amplifying transistor Q1 & the second amplifying transistor Q2) current versus the voltage, $V_{CE}$, across the collector, C, and the emitter, E, for different base currents, $I_B$ of the first amplifying transistor ($Q_1$). In the prior art Darlington amplifier 10, the Darlington amplifier 10 operates in the activation region once the first amplifying transistor ($Q_1$) reaches its activation region.

The Darlington amplifier 10 has a cut-off voltage, $V_{cut}$, and a saturation current of $I_{SAT}$, when the Darlington amplifier 10 operates in a saturation region 28. In the prior art Darlington amplifier 10, the Darlington amplifier 10 operates in the activation region once the first amplifying transistor ($Q_1$) reaches its activation region. The amplified output signal 18 may be set at a quiescent operating voltage, $V_Q$, which is the voltage of the amplified output signal 18 when no input signal 16 is provided at the input terminal 16. This quiescent operating voltage, $V_Q$, corresponds to a value of $V_{CEQ}$. The voltage values of the amplified output signal 18 swing across line 30 as the input signal 14 swings to and from its positive and negative peak values.

If the first amplifying transistor ($Q_1$) were coupled alone in a common emitter configuration, the amplified output signal 18 would need to provide a knee voltage, $V_{CEknee}$ (i.e. the saturation voltage of the first amplifying transistor Q1), in order for the first amplifying transistor ($Q_1$) to operate in the activation region. However, the Darlington amplifier 10 has an elevated knee voltage, $V_{knee}$ having a voltage value 32 instead. This is because the voltage at the emitter, E, of the first amplifying transistor ($Q_1$) is positively biased at ~$V_{BE2}$+ $I_{C2}$*$R_2$. Thus, in order for the first amplifying transistor ($Q_1$) to bias up to the forward active region, the knee voltage $V_{knee}$, must be provided at the voltage value 32, which may be approximated as:

$$V_{knee} \sim V_{CEknee} + V_{BE2} + I_{C2}*R_2.$$

In the saturation region 28, the Darlington amplifier 10 has a substantially non-linear response. Accordingly, the increase in the size of the saturation region 28 in the Darlington amplifier 10 substantially decreases the linearity of the amplified output signal 18 since the Darlington amplifier 10 operates non-linearly throughout a greater portion of the voltage swing of the input signal 14.

FIG. 3 is yet another embodiment of a prior art Darlington amplifier 34, which in this case uses three transistors 12 to amplify the input signal 14. The prior art Darlington amplifier 34 has the advantage of compounding the gains of the three transistors 12 to even further amplify the input signal 14. However, since the collector terminals, C, of each of the transistors 12 are all coupled to the output terminal 20 this further exacerbates the increase in the knee voltage $V_{knee}$ of the Darlington amplifier 34. By connecting each of the collectors, C, to the output terminal 20, the voltage of each of the collectors, C, will follow the swing of the amplified output signal 18. The net effect is to increase a knee voltage $V_{knee}$ to approximately:

$$V_{knee} \sim V_{CEsat1} + V_{BE2} + V_{BE3} + I_{C3}*R_3.$$

Accordingly, it is desirable to provide a Darlington topology that decreases a knee voltage of a Darlington amplifier thereby increasing the linearity of the Darlington amplifier while still allowing multiple transistors in the Darlington amplifier to amplify an input signal.

SUMMARY OF THE DISCLOSURE

The present disclosure relates to topologies for triplet transconductors and in particular to circuit topologies for triplet transconductors that may operate as Darlington amplifiers, but reduce a knee voltage thereby increasing the linearity of the Darlington amplifier. To reduce the knee voltage of one embodiment of the Darlington amplifier, a negative voltage is provided by a depletion mode FET between the emitter of one amplifying transistor and the base of another amplifying transistor. Reducing the knee voltage of the Darlington amplifier decreases the size of a saturation region thereby increasing linearity. In one embodiment, the Darlington amplifier has a first amplifying transistor and a second amplifying transistor, which may be bipolar junction transistors (BJTs), each having a base, an emitter, and a collector.

The base of the first amplifying transistor is coupled to receive the input signal and the collectors of each of the first amplifying transistor and the second amplifying transistor are operably associated so that both the first amplifying transistor and second amplifying transistor amplify the input signal. Between the first amplifying transistor and the second amplifying transistor is another transistor, such as a depletion mode field effect transistor (FET), which is activated by a negative voltage. The depletion mode FET has a gate, a source, and a drain, and the gate of the depletion mode FET is coupled to the emitter of the first amplifying transistor while the source of the depletion mode FET is coupled to the base of the second amplifying transistor.

By having the gate of the depletion mode FET coupled to the emitter of the first amplifying transistor and the source of the depletion mode FET coupled to the base of the second amplifying transistor, the negative voltage, $-V_{GS}$, that activates the depletion mode FET provides a negative voltage between the emitter of the first amplifying transistor and the base of the second amplifying transistor. The voltage at the emitter of the first amplifying transistor is thus lower than the voltage at the base of the second amplifying transistor. The negative voltage, $-V_{GS}$, provided by the depletion mode FET reduces the knee voltage of the Darlington amplifier and thus also decreases the size of the saturation region of the Darlington amplifier. Accordingly, the linearity of the Darlington amplifier is increased while allowing both the first amplifying transistor and the second amplifying transistor to amplify the input signal, thereby preserving the salient RF features and benefits of the original Darlington topology.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the Disclosure and illustrate the best mode of practicing the disclosure. Upon reading the following description in light of the accompanying drawing figures, those skilled in the art will understand the concepts of the Disclosure and will recognize applications of these concepts not particularly addressed herein. It should be understood that these concepts and applications fall within the scope of the disclosure and the accompanying claims.

The present disclosure is related to circuit topologies for a triplet transconductor that reduce a knee voltage. In particular, the triplet transconductor may operate as a Darlington amplifier having a reduced knee voltage. A Darlington amplifier has multiple amplifying transistors, which amplify an input signal. The amplifying transistors, as well as other associated transistors, in a Darlington amplifier may be bipolar junction transistors (BJTs), field effect transistors (FETs), or the like. As is known in the art, the main parts of a BJT are typically referred to as a base, an emitter, and a collector while the analogous parts of a FET are referred to as a gate, a source, and a drain. When referring to a transistor in this disclosure, the term "control" refers to the base in a BJT (or a device having parts similar to a BJT) and to the gate of an FET (or to a device having parts similar to a FET). The term "non-inverting output" is merely used to define an emitter in a BJT (or the like), and to the source of a FET (or the like). The term "inverting output" refers to the collector of a BJT (or the like) or to the drain of a FET (or the like).

Figure 4:
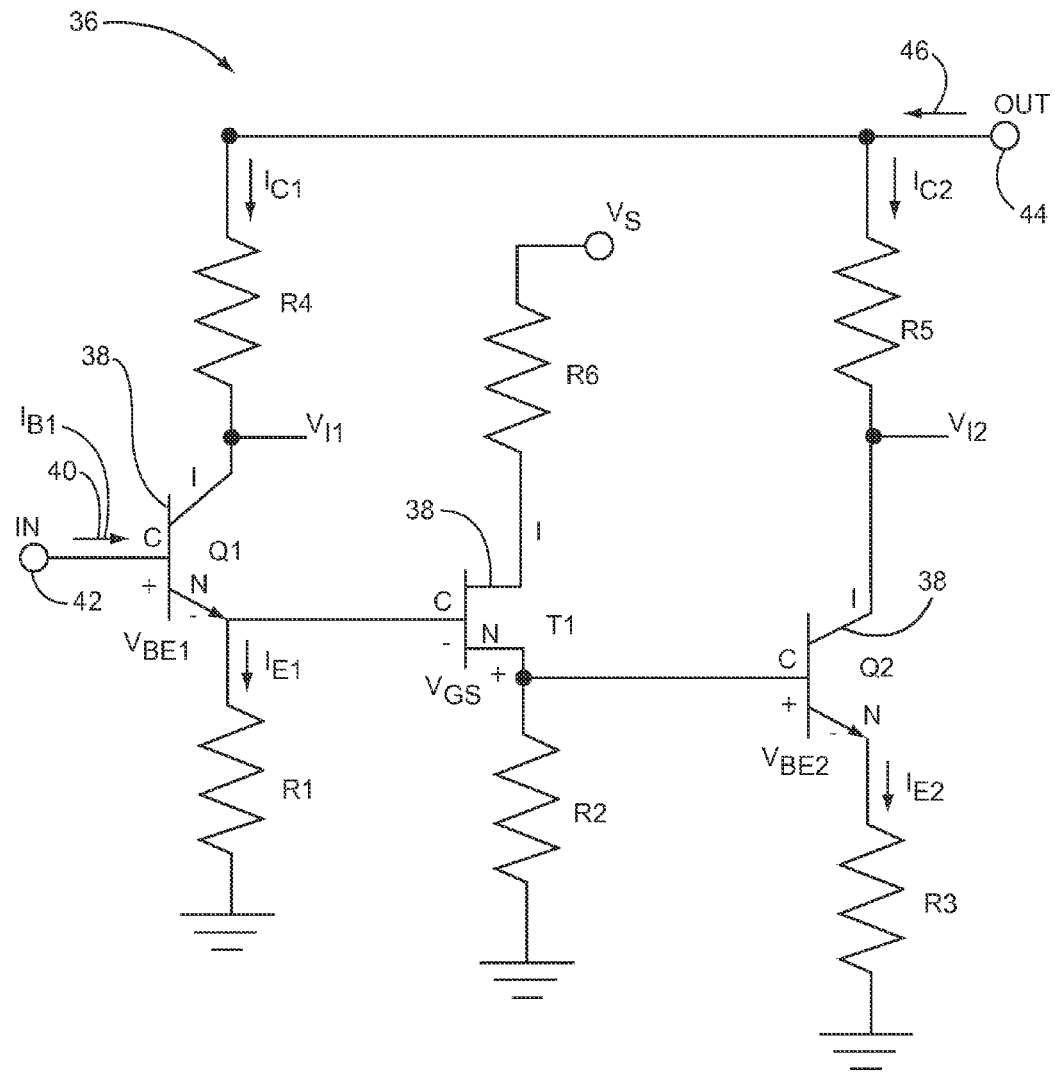
FIG. 4 illustrates a first embodiment of a triplet transconductor configured as a Darlington amplifier in accordance with this disclosure.

A triplet transconductor configured to operate as a Darlington amplifier 36 in accordance with this disclosure is illustrated in FIG. 4. The Darlington amplifier 36 includes amplifying transistors (referred to generically as elements 38 and to a specific amplifying transistor as elements, $Q_1$-$Q_2$). In this embodiment, the Darlington amplifier 36 has a first amplifying transistor ($Q_1$) and a second amplifying transistor ($Q_2$) and thus may be referred to as a Darlington pair. However, as explained in further detail below, the Darlington amplifier 36 may have any quantity of amplifying transistors 38 greater in number than the integer (1). Each amplifying transistor 38 includes a control, C, a non-inverting output, N, and an inverting output, I. In this case, the amplifying transistors 38 are heterostructure bipolar transistors (HBTs), which are a type of BJT, and thus the control, C, of each of the amplifying transistors 38 is a base, the non-inverting outputs, N, are emitters, and the inverting outputs, I, are collectors.

The control, C, of the first amplifying transistor ($Q_1$) is configured to receive an input signal 40 from an input terminal 42. The inverting outputs, I, of each of the amplifying transistors 38 are operably associated with one another and to an output terminal 44. In this case, the inverting outputs, I, of each of the amplifying transistors 38 are directly connected to one another and to the output terminal 44 so that the first amplifying transistor ($Q_1$) and the second amplifying transistor ($Q_2$) amplify the input signal 40 to generate an amplified output signal 46 at the output terminal 44. This may also compound the gains of each of the amplifying transistors 38 to generate the amplified output signal 46.

The inverting outputs, I, of the first amplifying transistor ($Q_1$) and the second amplifying transistor ($Q_2$) may be directly or indirectly coupled to other internal voltage sources (not shown), external voltage sources (not shown), or network nodes (not shown), which provide the energy for amplifying the input signal 40. For example, an external voltage source may apply a supply voltage at the output terminal 44. Also, the inverting outputs, I, may be connected to these supply voltages through different network topologies. For example, one or more resistors, such as $R_4$, $R_5$, may be connected between the inverting outputs, I, and the supply voltage.

To place the first amplifying transistor ($Q_1$), in the activation state, a positive voltage of at least $V_{CEknee1}$ (i.e. the saturation voltage of the first amplifying transistor $Q_1$) is required between the inverting output, I, and the non-inverting output, N, of the first amplifying transistor ($Q_1$). The first amplifying transistor ($Q_1$) is an NPN type of device that experiences a positive voltage drop, $V_{BE1}$, from the control, C, to non-inverting output, N. The second amplifying transistor ($Q_2$) also may be an NPN type device that experiences a positive voltage drop from the control, C, to the non-inverting output, N, of $V_{BE2}$. A positive voltage of at least $V_{CEknee2}$ (i.e. the saturation voltage of the second amplifying transistor $Q_2$) is required between the inverting output, I, and the non-inverting output, N, of the second amplifying transistor ($Q_2$) to place the second amplifying transistor in its activation state ($Q_2$). In other words, $V_{CEknee1}$ and $V_{CEknee2}$ are the knee voltages of the first amplifying transistor ($Q_1$) and the second amplifying transistor ($Q_2$), respectively, if the first amplifying transistor ($Q_1$) and the second amplifying transistor ($Q_2$) were coupled individually in a common emitter configuration.

The Darlington amplifier 36 may be placed in the activation state by the amplifying transistor 38 having the highest voltage presented at the non-inverting output, N. In this embodiment, this is the first amplifying transistor ($Q_1$) but, as explained in further detail below, in other embodiments, this may be the second amplifying transistor ($Q_2$). Next, another transistor ($T_1$) is coupled between the first amplifying transistor ($Q_1$) and the second amplifying transistor ($Q_2$). This transistor ($T_1$) is uncoupled to the output terminal 44 and to the inverting outputs, I, of each of the amplifying transistors 38 and thus, the non-inverting output, N, of the transistor ($T_1$) is not biased by the amplified output signal 46. Instead, an inverting output, I, of the transistor ($T_1$) is connected to receive a supply voltage, $V_S$, that is independent of the amplified output signal 46. The transistor ($T_1$) also has a control, C, and a non-inverting output, N. The transistor ($T_1$) is configured to be activated by a negative voltage, $-V_{GS}$, between the control, C, and the non-inverting output, N. In this case, the transistor ($T_1$) is a depletion mode FET and thus the control, C, is a gate, the non-inverting output, N, is a source, and the inverting output, I is a drain. If the negative voltage, $-V_{GS}$, is greater in magnitude than a pinch-off voltage ($-V_p$) associated with the depletion mode FET ($T_1$), a channel in the transistor ($T_1$) is created and the transistor ($T_1$) is turned on. In the alternative, other embodiments may use other types of transistors ($T_1$) that are activated by negative voltages between the non-inverting output, N, and an inverting output, I, such as for example, a PNP type BJT. Also as discussed above, the inverting outputs, I of the amplifying transistors ($Q_1$, $Q_2$) are operably associated with one another such that the first amplifying transistor ($Q_1$) and the second amplifying transistor ($Q_2$) amplify the input signal 40. In the illustrated embodiment of FIG. 4, the inverting outputs, I of the amplifying transistors ($Q_1$, $Q_2$) are discrete components that are connected to one another. However, in the alternative, the inverting outputs, I, of the amplifying transistors ($Q_1$, $Q_2$) may be operably associated by being integrated to form an integrated whole. For example, a single integrated N region on a semiconductor substrate may be used to form and operably associate the inverting outputs, I of each of the amplifying transistors ($Q_1$, $Q_2$). Note that the Darlington amplifier 36 may be a four terminal device as opposed to the three terminal device of a typical Darlington amplifier. The first terminal being the input terminal 42, the second terminal being the output terminal 44, the third terminal being the terminal that currently connects the non-inverting outputs, N of transistors ($Q_1$, $Q_2$, $T_1$) to ground, and the fourth terminal being the terminal that provides the supply voltage, $V_s$.

The first amplifying transistor ($Q_1$) generates, a collector current, $I_{C1}$, and an emitter current, $I_{E1}$, which may be substantially equal to one another, if a base current $I_{B1}$ of the input signal 40, is relatively low. Similarly, the second amplifying transistor ($Q_2$) generates, a collector current, $I_{C2}$, and an emitter current, $I_{E2}$, which may also be substantially equal to one another. Since the inverting outputs, I, of both the first amplifying transistor ($Q_1$) and the second amplifying transistor ($Q_2$) are operably associated with one another and to the output terminal 44, both the inverting output voltages $V_{I1}$, $V_{I2}$ and thus also the collector currents, $I_{C1}$, $I_{C2}$, amplify the input signal 40. However, the inverting output, I of the transistor ($T_1$) is not connected to the inverting outputs, I of the amplifying transistors 38. Also, the control, C, of the transistor ($T_1$) is connected to the non-inverting output, I, of the first amplifying transistor ($Q_1$) and the non-inverting output, N of the transistor ($T_1$) is connected to the control, C, of the second amplifying transistor ($Q_2$).

The transistor ($T_1$) is activated by the negative voltage, $-V_{GS}$, between the control, C, and the non-inverting output, N, of the transistor ($T_1$), and the inverting output, I, is not biased by the output terminal 44. Thus, the negative voltage, $-V_{GS}$, provides the voltage at the control, C, of the transistor ($T_1$) and thus also the non-inverting output, N of the first amplifying transistor ($Q_1$) lower than the voltage at the non-inverting output, N, of the transistor ($T_1$) and thus also the voltage at the control, C, of the second amplifying transistor ($Q_2$). The negative voltage, $-V_{GS}$, thus counterbalances the positive voltage applied by the second amplifying transistor ($Q_2$), at the non-inverting output, N of the first amplifying transistor ($Q_1$). This lowers the knee voltage, $V_{knee}$, of the Darlington amplifier 36. The knee voltage, $V_{knee}$ of the Darlington amplifier 36 may be estimated to be approximately:

$$V_{knee} \sim V_{CEknee1} + (-V_{GS}) + V_{BE2} + I_{C2} * R_3$$

Figure 1:
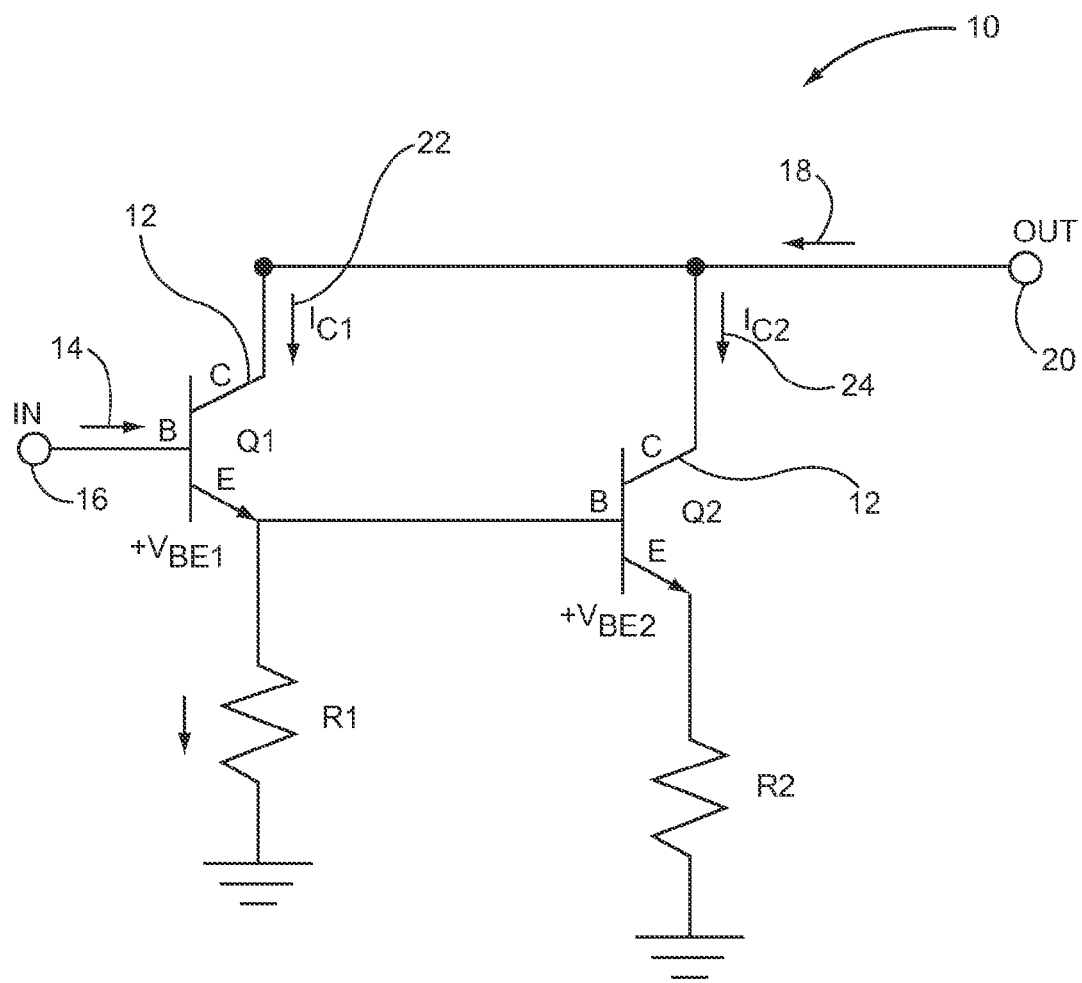
FIG. 1 illustrates a prior art Darlington amplifier.
Figure 2:
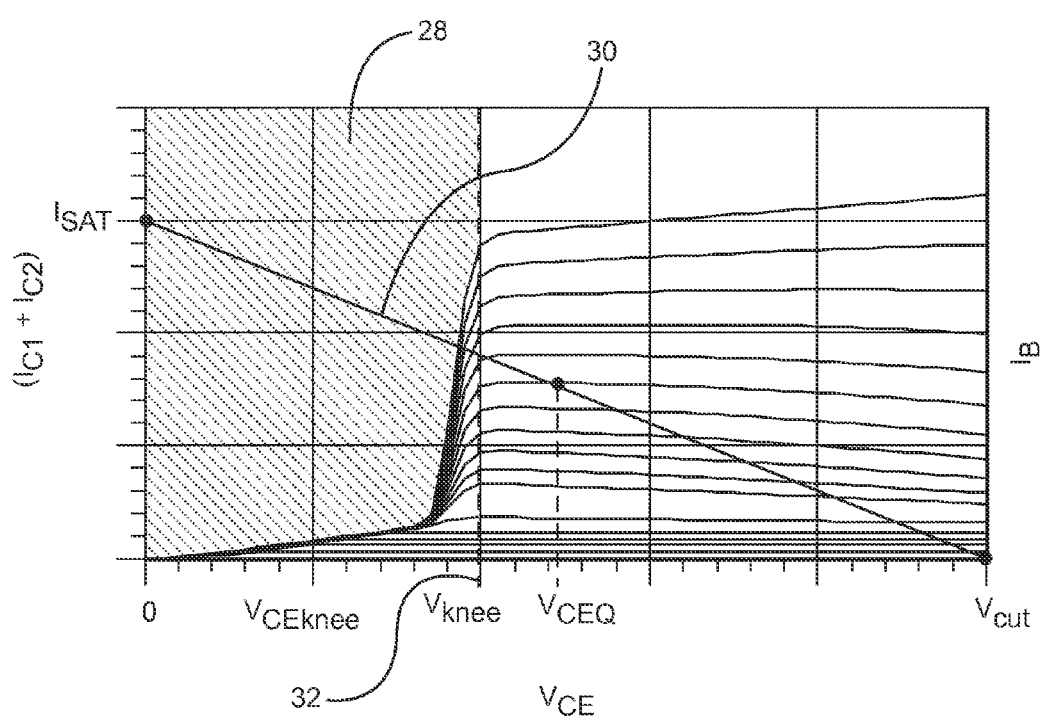
FIG. 2 illustrates a graph showing a knee voltage of the prior art Darlington amplifier of FIG. 1.
Figure 3:
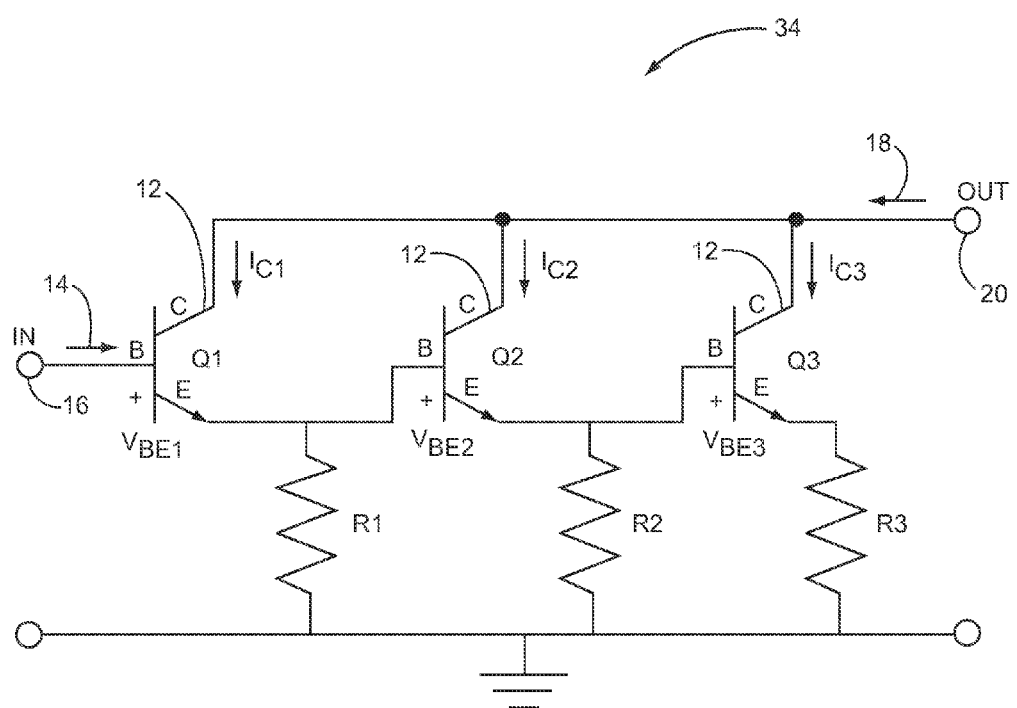
FIG. 3 illustrates yet another prior art Darlington amplifier.

Consequently, the knee voltage, $V_{knee}$, of the Darlington amplifier 36 has been reduced by the voltage ($-V_{GS}$). If the inverting output, I, of the transistor ($T_1$) were not uncoupled from the inverting outputs, I, of the amplifying transistors 38, the inverting output, I of the transistor ($T_1$) would be prone to saturating under large output signal 46 swings thereby effectively increasing the knee voltage to that of a conventional Darlington amplifier of FIG. 1 (since the transistor $T_1$ would be employed as an amplifying transistor whose voltage at the non-inverting output, N, would be the control voltage of second amplifying transistor $Q_2$). Note that the negative voltage ($-V_{GS}$) is negative from the non-inverting output, N, to the control, C. However, this does not necessary imply that the voltage at the control, C, of the transistor ($T_1$) is negative relative to ground. Rather, negative voltage ($-V_{GS}$) is negative from the non-inverting output, N, to the control, C of the transistor ($T_1$) and the voltage at the control, C, may be either positive or negative with respect to ground.

In alternative embodiments, the knee voltage, $V_{knee}$, of the Darlington amplifier 36 may instead be determined by the knee voltage, $V_{CEknee2}$, of the second amplifying transistor ($Q_2$). The negative voltage, $-V_{GS}$, of the depletion mode FET counterbalances the additional positive voltage applied by the second amplifying transistor ($Q_2$) at the non-inverting output, N, of the first amplifying transistor ($Q_1$). At a certain point however, the negative voltage $-V_{GS}$ of the depletion mode FET ($T_1$) can be high enough so that the positive voltage applied by the second amplifying transistor ($Q_2$) to the non-inverting output, N, of the first amplifying transistor ($Q_1$) is completely counterbalanced. In one particular instance, [$|V_{GS}|\sim|V_{BE2}|$] and the voltage presented at the non-inverting output, N, of first amplifying transistor ($Q_1$) will essentially be $V_{CEknee2}$ (i.e. the saturation voltage of the second amplifying transistor $Q_2$).

The knee voltage of the Darlington amplifier 36 may be approximately:

$$V_{knee} \sim V_{CEknee1} + (V_{GS} + V_{BE2} = 0) + V_{CEknee2}$$

If you continued and the negative voltage, $-V_{GS}$, was even higher, then the voltage at the non-inverting output, N, would actually be decreased at the non-inverting output, N, of the first amplifying transistor ($Q_1$). Thus, assuming that both of the devices had the same saturation voltages (i.e. $V_{CEknee1} \sim V_{CEknee2}$) there may actually be a higher voltage at the non-inverting output, N, of the second amplifying transistor ($Q_2$) than the first amplifying transistor ($Q_1$) and thus at this point, the saturation voltage, $V_{CEknee2}$, of the second amplifying transistor ($Q_2$) would determine the knee voltage, $V_{knee}$ of the Darlington amplifier 36. Accordingly, this may occur when, for example, when [$|V_{GS}|>|V_{BE2}|$]. In one case, the negative voltage, $-V_{GS}$ of the transistor ($T_1$) is approximately $|V_{GS}|\sim V_{CEknee2} + V_{BE2} + V_{CEknee1}$ and thus the knee voltage, $V_{knee}$ of the Darlington amplifier is approximately 0V. However, the resistor, R1, may need to be replaced or provided with an inductor, $L_1$ (shown in FIG. 8), in order to maintain a finite RF(AC) impedance so that the input signal 40 provided at RF frequencies may propagate through the depletion mode FET ($T_1$) to the second amplifying transistor ($Q_2$) and provide the desired amplification. If one continued to raise the magnitude of the negative voltage, ($-V_{GS}$), the topology may even be able to achieve a negative knee voltage, $V_{knee}$.

It should be noted that the above mentioned equations describe relationships for the topology illustrated in FIG. 4. Other topologies are within the scope of this disclosure and may include additional components coupled to the control, C, non-inverting output, N, and inverting output, I of the transistors, ($Q_1$, $Q_2$, $T_1$). For example, passive components, such as resistors, capacitors, and inductors, or networks built from these passive components, may be coupled to the control, C, non-inverting output, N, and inverting output, I of the transistors, ($Q_1$, $Q_2$, $T_1$) and modify the above mentioned relationships. In addition, some circuit topologies may use transistors with different characteristics other than those of transistors, ($Q_1$, $Q_2$, $T_1$) and thus the above-mentioned relationships may not be accurate estimations for these topologies. In addition, the non-ideal behavior of transistors, ($Q_1$, $Q_2$, $T_1$) may be significant in certain applications, also causing the above-mentioned relationships to not be accurate. Those skilled in the art would recognize how to modify calculating the above-described relationships for different circuit topologies and for non-ideal transistor behavior in light of the teachings of this disclosure.

Figure 5:
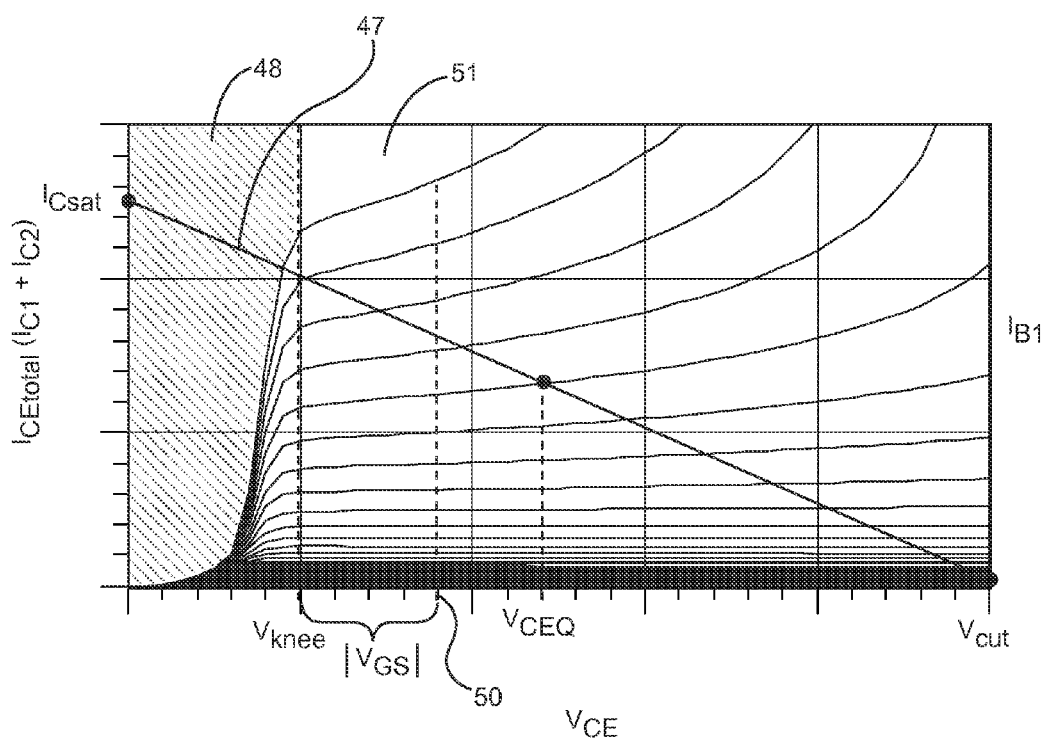
FIG. 5 is a graph showing a knee voltage of the Darlington amplifier illustrated in FIG. 4.

Referring now to FIGS. 4 and 5, the graph in FIG. 5 illustrates the total Darlington collector current, $I_{CEtotal}$(Ic1+Ic2) of the Darlington amplifier 36. During operation, the voltage, $V_{CE}$, swings along line 47, as the input signal 40 varies from a positive peak to a negative peak. The currents, $I_{CEtotal}$(Ic1+Ic2) in FIG. 5 are provided for different base currents, $I_{B1}$ of the input signal 40. As discussed above, the first amplifying transistor ($Q_1$) in the embodiment illustrated in FIG. 4 determines the knee voltage, $V_{knee}$, of the Darlington amplifier 36. The first and second amplifying transistors ($Q_1$ & $Q_2$) have a cut-off voltage, $V_{cut}$, and a saturation current of $I_{Csat}$, in a saturation region 48.

The amplified output signal 46 has a quiescent operating voltage, $V_Q$ (not shown), which is the voltage of the amplified output signal 46 when no input signal 40 is provided at the input terminal 16. This quiescent operating voltage, $V_Q$, corresponds with the operating voltage, $V_{CEQ}$, of $V_{CE}$ in FIG. 5. If the transistor ($T_1$) were not provided between the first amplifying transistor ($Q_1$) and the second amplifying transistor ($Q_2$), then the knee voltage, $V_{knee}$ would be around the voltage 50. However, the transistor ($T_1$) applies the negative voltage ($-V_{GS}$) to the non-inverting output, N, of the first amplifying transistor ($Q_1$). Since the inverter output, I of the transistor ($T_1$) is not coupled to the inverter outputs, I, of the amplifying transistors ($Q_1$, $Q_2$), the non-inverting output, N, of the transistor ($T_1$) is not biased by the amplified output signal 46. Thus, the negative voltage ($-V_{GS}$) causes a drop in the knee voltage $V_{knee}$, of approximately $|V_{GS}|$ to the value shown in FIG. 5. As a result, this causes a significant decrease in the saturation region 48 and increases an activation region 51 of the Darlington amplifier 36, which improves the linearity of the Darlington amplifier 36.

Figure 6:
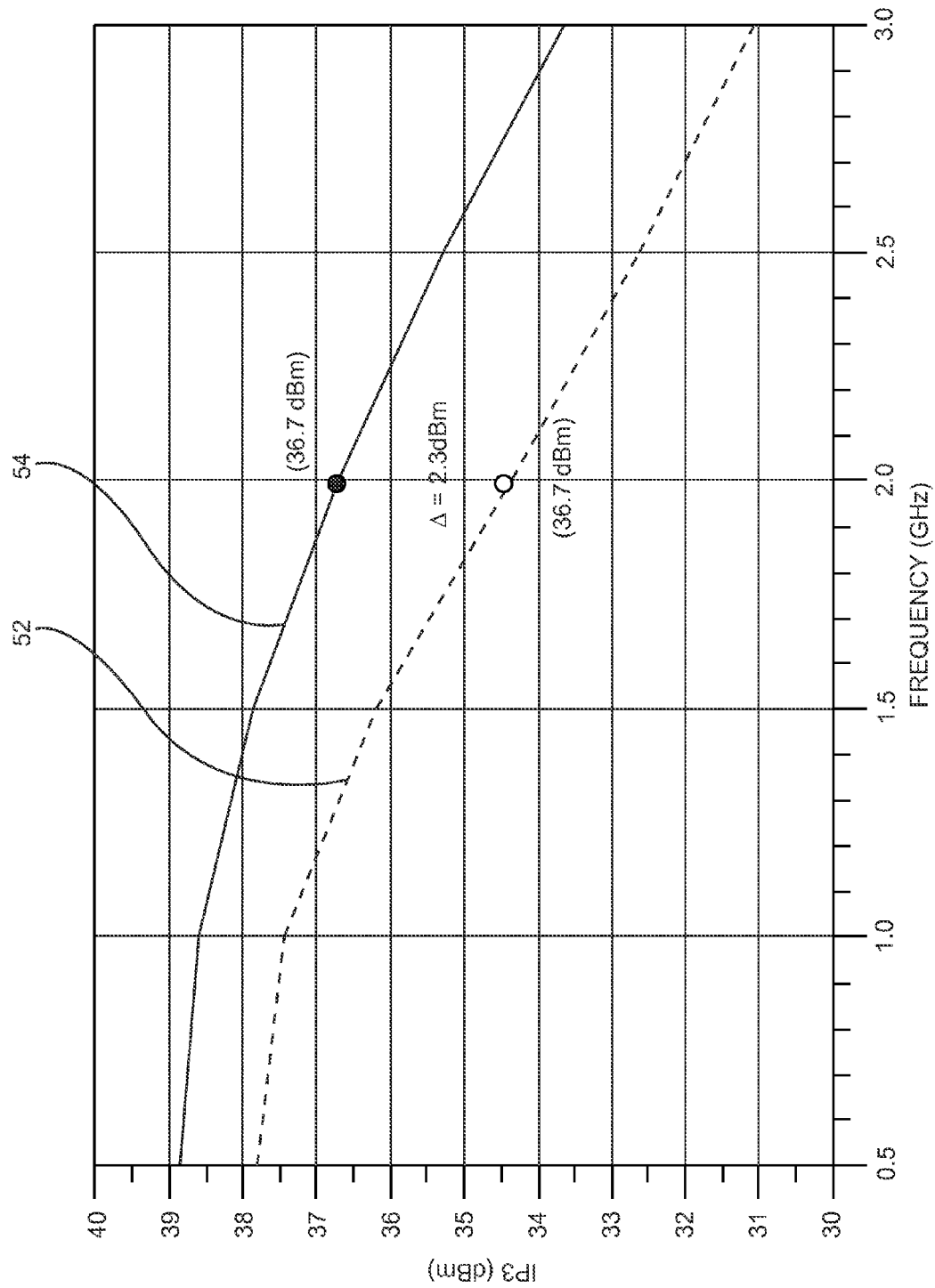
FIG. 6 is a graph showing an improvement in IP3 of the Darlington amplifier illustrated in FIG. 4.

Referring now to FIGS. 4 and 6, the improvement in linearity for the Darlington amplifier 36 is demonstrated by the graph of FIG. 6. For this graph, it is assumed that the Darlington amplifier 36 in FIG. 4 has been built on a Gallium Arsenide (GaAs) type semiconductor substrate and is operating at 5V and 80 mA. The first line 52 is the IP3 of the prior art Darlington amplifier 10 in FIG. 1 that does not use the transistor ($T_1$) while the second line 54 is the IP3 of the Darlington amplifier 36 shown in FIG. 4. As illustrated by FIG. 6, an improvement of 2.3 (dBm) is shown by the Darlington amplifier 36 of FIG. 4 versus the conventional Darlington amplifier 10 in FIG. 1 when the input signal 40 is at 2 GHz.

Figure 7:
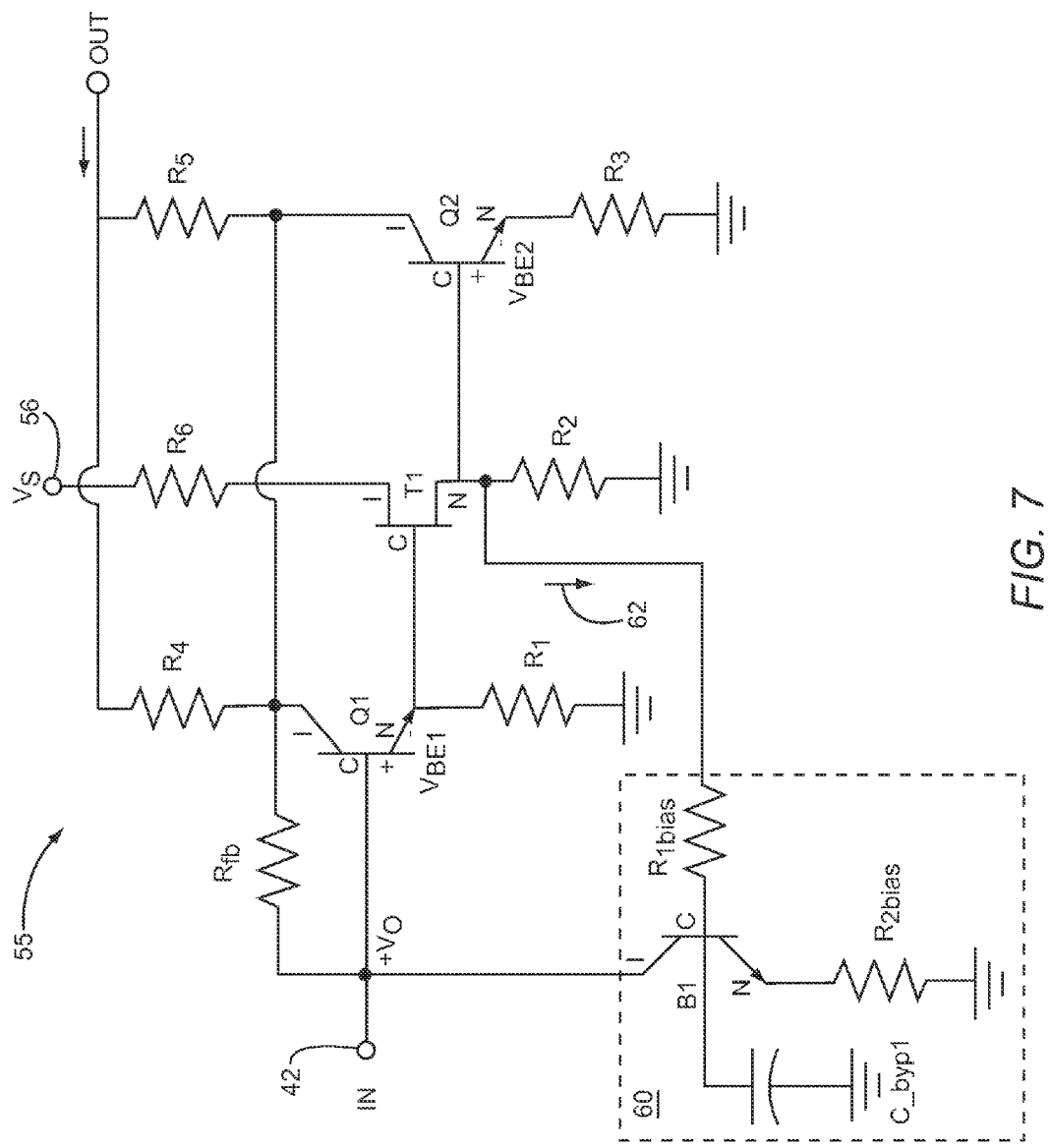
FIG. 7 illustrates a second embodiment of a Darlington amplifier in accordance with this disclosure.

FIG. 7 illustrates another embodiment of a Darlington amplifier 55 similar to the Darlington amplifier 36 shown in FIG. 4. In this embodiment, the transistor ($T_1$) is coupled to receive a first supply voltage, $V_s$, at a supply terminal 56 just as in FIG. 4. The energy for amplification by the first amplifying transistor ($Q_1$) and second amplifying transistor ($Q_2$) may be provided by any suitable circuit. For example, the Darlington amplifier 55 and other Darlington amplifiers disclosed herein may be provided within a network that provides the desired biasing voltages to provide energy for amplification. In one case, the Darlington amplifier 55 and the other Darlington amplifiers disclosed herein may utilize self-biasing circuitry as disclosed in U.S. Pat. No. 6,927,634, entitled "Self-biased Darlington Amplifier" and filed on Jul. 18, 2003, which is incorporated herein by reference in its entirety. Similarly, biasing circuitry such as that disclosed in U.S. Pat. No. 6,727,762 entitled "Direct Coupled Distributed Amplifier" and filed on Nov. 26, 2002, which is incorporated herein in its entirety, may be utilized for the Darlington amplifier 55 and other Darlington amplifiers through this disclosure.

Referring again to FIG. 7, the Darlington amplifier 55 includes a self-biasing circuit 60, which is configured to generate an operating voltage, $V_O$, which is applied to the input signal 40. The operating voltage $V_O$, reduces variations in the quiescent operating voltage, $V_Q$, of the Darlington amplifier 55. The quiescent operating voltage, $V_Q$, is the output voltage of the amplified output signal 46. If only the DC operating voltage, $V_O$, is presented to the control of the first amplifying transistor ($Q_1$), the amplified output signal 46 should have a voltage around the quiescent operating voltage, $V_Q$. Thus, the peak to peak voltages of the amplified output signal 46 are centered about the quiescent operating voltage, $V_Q$, while the peak to peak voltages of the input signal 40 at the control, C, of the first amplifying transistor ($Q_1$) are centered about the operating voltage, $V_O$.

During a transient state, the self-biasing circuit 60 is activated in response to the voltage at the non-inverting output, N, of the transistor ($T_1$). The transistor (T1) activates a control, C, of a self-biasing transistor ($B_1$) configured to apply the appropriate operating voltage, $V_O$ so that the amplified output signal 46 has a quiescent operating voltage of $V_Q$. The resistance values of resistors, $R_{1bias}$, $R_{fb}$, and $R_{2bias}$ may be selected such that the self-biasing transistor ($B_1$) generates the operating voltage, $V_O$, from an inverting output, I, of the self-biasing transistor ($B_1$) during steady state operation.

The self-biasing circuit 60 may be coupled between the input terminal 42 and the control, C, of the second amplifying transistor ($Q_2$) (or non-inverting output, N of the transistor $T_1$) to provide a feedback loop that reduces variations in the quiescent operating voltage of $V_Q$. In this example, the control, C, of the self-biasing transistor ($B_1$) is coupled to the non-inverting output, N of the transistor ($T_1$). In this manner, the feedback loop controls the operation of the self-biasing transistor ($B_1$) in accordance with a feedback output signal 62 associated with the voltage at the non-inverting output, N, of the transistor ($T_1$). The feedback output signal 62 can be sensed by the self-biasing circuit 60 to adjust the operating voltage, $V_O$ and maintain the quiescent operating voltage, $V_Q$, of the amplified output signal 46 relatively steady.

Next, the Darlington amplifier 55 may be formed on a single semiconductor substrate (not shown) to reduce the physical space and materials required by the Darlington amplifier 55 but may also be formed so that one or more of the components of the Darlington amplifier 55 are provided on separate semiconductor substrates. Typically, semiconductor substrates have a handle layer made from a particular semiconductive material, such as, Silicon (Si), Gallium Arsenide (GaAs), Gallium Nitride (GaN), or the like. The components of the electronic circuit are built on a device layer, which may include doped regions of the selected semiconductive material or other types of materials to form transistors and other electronic components. One or more additional layers may be provided above, below, and between the handle layer and the device layer. Whether a single semiconductor substrate is used or various semiconductor substrates are used may depend on the desired characteristics of the transistors ($Q_1$, $Q_2$, $T_1$, $B_1$) to be used for a desired application. In the embodiment illustrated in FIG. 5, the amplifying transistors ($Q_1$, $Q_2$), and the self-biasing transistor (B1) are HBTs and the transistor ($T_1$) is a depletion mode FET and all of the transistors ($Q_1$, $Q_2$, $B_1$) are NPN type transistors. A GaAs type substrate is naturally predisposed for building depletion mode FETs, such as transistor ($T_1$), and thus forming the Darlington amplifier 55 on a GaAs type substrate may be advantageous.

Figure 8:
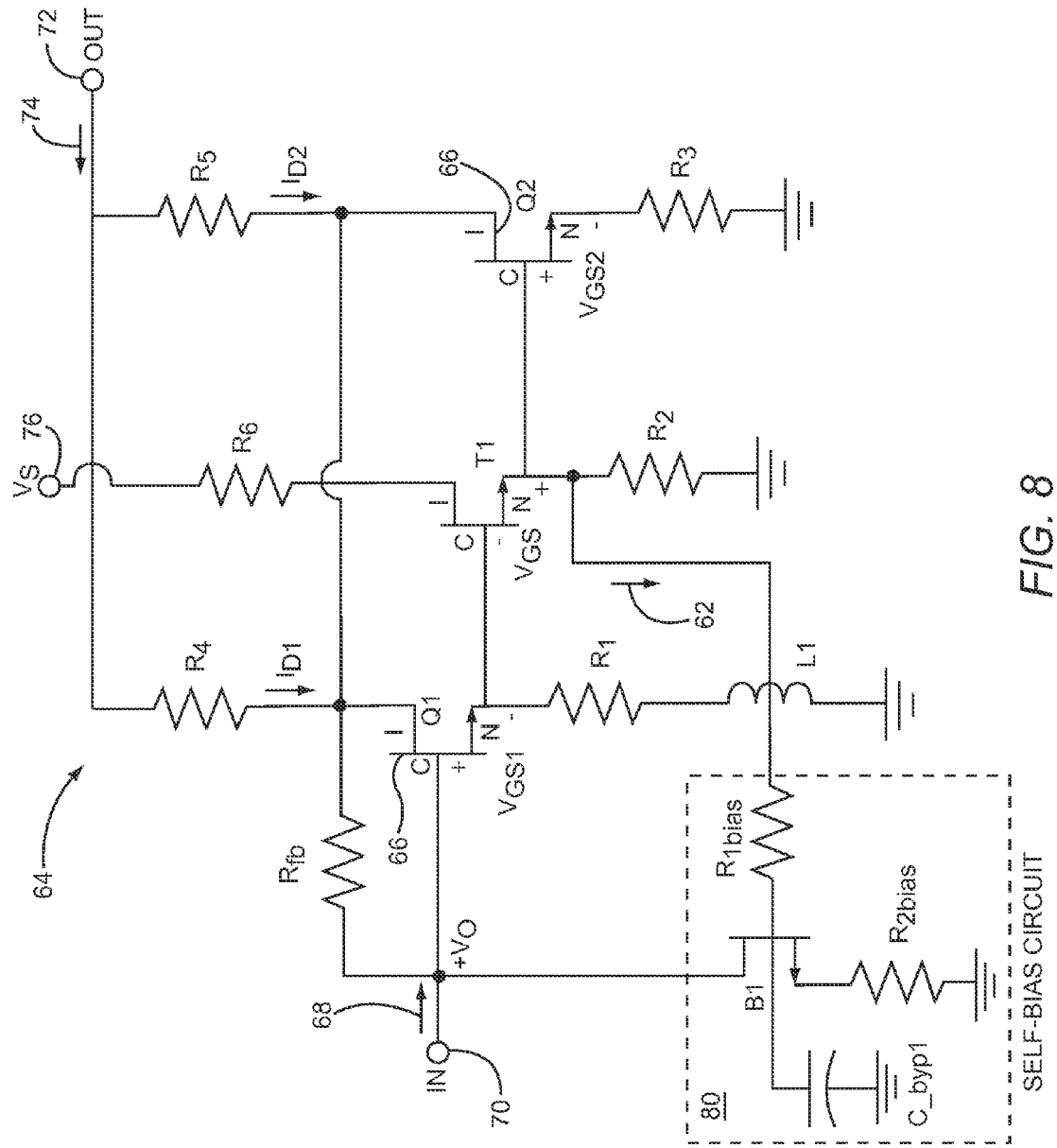
FIG. 8 illustrates a third embodiment of a Darlington amplifier in accordance with this disclosure.

Referring now to FIG. 8, another embodiment of a Darlington amplifier 64 is shown. As explained above, the Darlington amplifier 64 has a knee voltage, $V_{knee}$. The Darlington amplifier 64 includes amplifying transistors (referred to generically as elements 66 and specifically to a specific amplifying transistor as elements, $Q_1$-$Q_2$) that amplify an input signal 68 received at an input terminal 70. In this embodiment, the Darlington amplifier 64 has a first amplifying transistor ($Q_1$) and a second amplifying transistor ($Q_2$) and thus may be referred to as a Darlington pair. However, as explained in further detail below, the Darlington amplifier 64 may have any quantity of amplifying transistors 66 greater in number than the integer (1). Each amplifying transistor 66 includes a control, C, a non-inverting output, N, and an inverting output, I. In this case, the amplifying transistors 66 are enhancement mode FETs, and thus the control, C, of each of the amplifying transistors 66 is a gate, the non-inverting outputs, N, are sources, and the inverting outputs, I, are drains. The amplifying transistors 66 require a positive voltage between the control, C, and the non-inverting output, N equal to or above a threshold voltage to form a channel and turn on the amplifying transistors 66.

To amplify the input signal 68, the control, C, of the first amplifying transistor ($Q_1$) is configured to receive the input signal 68 by being connected to the input terminal 70. The inverting outputs, I, of each of the amplifying transistors 66 are operably associated with one another and to an output terminal 72. In this case, the inverting outputs, I, of each of the amplifying transistors 66 are directly connected to one another and to the output terminal 72 so that the first amplifying transistor ($Q_1$) and the second amplifying transistor ($Q_2$) amplify the input signal 68 to generate an amplified output signal 74 at the output terminal 72. The connection of the inverting outputs, I, of the amplifying transistors 66 may also compound the gains of each of the amplifying transistors 66.

Another transistor ($T_1$) is coupled between the first amplifying transistor ($Q_1$) and the second amplifying transistor ($Q_2$) to lower the knee voltage of the Darlington amplifier 64. An inverting output, I of the transistor ($T_1$) is uncoupled from the output terminal 72 and from the inverting outputs, I, of each of the amplifying transistors 66. Instead, the inverting output, I, of the transistor ($T_1$) is connected to receive a supply voltage, Vs, from supply terminal 76. Supply terminal 76 is uncoupled from the output terminal 72 so that the non-inverting output, N, of the transistor ($T_1$) is biased independently from the amplified output signal 74. The transistor ($T_1$) also has a control, C, and a non-inverting output, N. The transistor ($T_1$) is configured to be activated by a negative voltage, $-V_{GS}$, between the control, C, and the non-inverting output, N. Consequently, the transistor ($T_1$) may be a depletion mode FET and thus the control, C, is a gate, the non-inverting output, N, is a source, and the inverting output, I is a drain. If the negative voltage, $-V_{GS}$, is greater in magnitude than a pinch-off voltage $(-V_p)$ associated with the depletion mode FET ($T_1$), a channel in the depletion mode FET ($T_1$) is created and the depletion mode FET ($T_1$) is turned on. The inductor L1 may be used, as explained above, if the knee voltage of the Darlington amplifier 64 is set by the negative voltage $-V_{GS}$ to be ~0V. Also, the inductor L1 provides a finite RF impedance so that the input signal 68 is not RF shorted to ground when the voltage on non-inverting output, N, of the first amplifying transistor ($Q_1$) is set close to ground.

In this embodiment, the Darlington amplifier 64 may be placed in the activation region by the first amplifying transistor ($Q_1$), since the voltages presented to the non-inverting output, N, of the first amplifying transistor ($Q_1$) are higher than the voltages presented to the non-inverting output, N, of the second amplifying transistor ($Q_2$). In other embodiments, as explained above, this may not be the case and the highest voltages may be experienced at the non-inverting output, N, of the second amplifying transistor ($Q_2$). Since the transistor ($T_1$) cannot be placed in a saturation region by the amplified output signal 74, the negative voltage, $-V_{GS}$, lowers the voltage at the non-inverting output, N, of the first amplifying transistor ($Q_1$) by a magnitude of approximately $|V_{GS}|$. In this manner, a voltage at the non-inverting output, N, of the first amplifying transistor ($Q_1$) is provided that is lower than the voltage at the control, C, of the second amplifying transistor ($Q_2$). As a result, the knee voltage, $V_{knee}$, of the Darlington amplifier is also decreased by a magnitude of about $|V_{GS}|$.

The voltage, $V_{GSknee1}$, is the knee voltage of the first amplifying transistor ($Q_1$) individually if the first amplifying transistor ($Q_1$) were configured as a common-source transistor (i.e. the saturation voltage of the first amplifying transistor $Q_1$). The first amplifying transistor ($Q_1$) and the second amplifying transistor ($Q_2$) generate drain currents, $I_{D1}$, and $I_{D2}$ in response to the input signal 68. Also, threshold voltages, $+V_{GS1}$, and $+V_{GS2}$, are the voltages from the control, C, to the non-inverting output, N, of the first amplifying transistor ($Q_1$) and the second amplifying transistor ($Q_2$). Thus, the knee voltage, $V_{knee}$ of the Darlington amplifier 64 may be estimated as:

$$V_{knee} \sim V_{GSknee1} - V_{GS} + V_{GS2} + I_{D2} * R_3$$

The Darlington amplifier 64 also includes a self-biasing circuit 80 that includes a self-biasing transistor ($B_1$) which provides the appropriate operating voltage, $V_O$, and thereby sets the quiescent operating voltage, $V_Q$, of the amplified output signal 74, as explained above. The Darlington amplifier 64 may be formed on a single semiconductor substrate (not shown) to reduce the physical space and materials required by the Darlington amplifier 64 but one or more of the components of the Darlington amplifier 64 may also be provided on separate semiconductor substrates. In the embodiment illustrated in FIG. 8, the amplifying transistors ($Q_1$, $Q_2$), are enhancement mode FETs and the transistor ($T_1$) is a depletion mode FET. A GaN type substrate is naturally predisposed for building both enhancement mode and depletion mode FETs, such as transistor ($Q_1$, $Q_2$, B1, $T_1$), and thus forming the Darlington amplifier 64 on a GaN type substrate may be advantageous.

Figure 9:
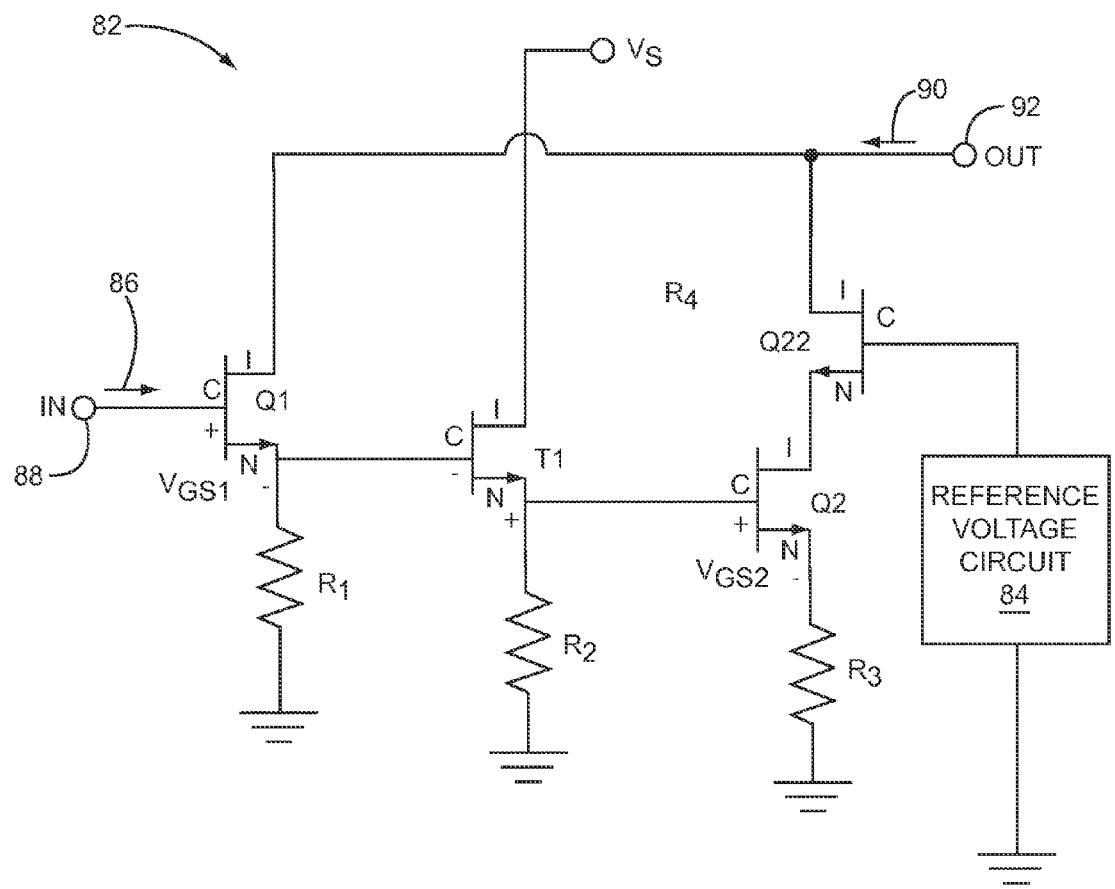
FIG. 9 illustrates a fourth embodiment of a Darlington amplifier in accordance with this disclosure.

FIG. 9 shows yet another embodiment of a Darlington amplifier 82. The Darlington amplifier 82 includes a first amplifying transistor ($Q_1$), a second amplifying transistor ($Q_2$), a transistor ($Q_{22}$), a transistor ($T_1$) and a reference voltage circuit 84. The first amplifying transistor ($Q_1$) and the second amplifying transistor ($Q_2$) are configured as a Darlington amplifier 82.

An input signal 86 may be presented through an input terminal 88 to a control, C of the first amplifying transistor ($Q_1$) and, in this case, is implemented as a voltage signal. An amplified output signal 90 may be generated at an output terminal 92 from the inverting outputs, I of the transistors ($Q_1$) and ($Q_{22}$). The amplified output signal 90 may be implemented as a current signal.

The first amplifying transistor ($Q_1$), the second amplifying transistor ($Q_2$), the transistor ($Q_{22}$), and the transistor ($T_1$) can also be referred to as a type of Darlington amplifier known as a Darlington cascode amplifier. The reference voltage circuit 84 may be connected to a control, C of the transistor ($Q_{22}$). A non-inverting output, N of the first amplifying transistor ($Q_1$) may be connected to a control, C of the transistor ($T_1$) and the non-inverting output, I of the transistor ($T_1$) may be coupled to the control, C of the second amplifying transistor ($Q_2$). A non-inverting output, N of the transistor ($Q_{22}$) is generally connected to an inverting output, I, of the second amplifying transistor ($Q_2$). The transistor ($Q_{22}$) may provide a similar breakdown voltage and thermal stability as a diode.

The reference voltage circuit 84 may provide/ensure wide band control, thermal stability, and electrical stability. The reference voltage circuit 84 may be implemented with a low impedance output stage that may be connected to a control, C of the transistor ($Q_{22}$). The reference voltage circuit 84 may be configured to provide a bias signal to the control, C of the transistor ($Q_{22}$). In one example, the reference voltage circuit 84 may be implemented as a band-gap reference and voltage generation circuit. However, the reference voltage circuit 84 may be implemented as any appropriate low impedance voltage reference generator to meet the design criteria of a particular application. The reference voltage circuit 84 may reduce a thermal-electric feedback of the transistor ($Q_{22}$). Generally, the lower the impedance of the reference voltage circuit 84, the higher the effective breakdown voltage of the Darlington amplifier 82.

Furthermore, the reference voltage circuit 84 may provide electronic bias optimization. For example, bias tuning the control, C of the transistor ($Q_{22}$) via adjustment of the reference voltage circuit 84 impedance and/or bias signal may provide improved intermodulation distortion response (when compared to conventional approaches) due to the optimization of cancellation mechanisms within the topology of the Darlington amplifier 82. In addition, the implementation of different load impedances on the control, C of the transistor ($Q_{22}$) (e.g., implementing the reference voltage circuit 84 having different impedances) may also provide uniquely optimized intermodulation distortion. The features of the Darlington cascode amplifier are described in U.S. Pat. No. 6,806,778, filed on Feb. 18, 2003 and entitled "Darlington Cascode", which is hereby incorporated by reference in its entirety.

In the Darlington amplifier 82 of FIG. 9, the first amplifying transistor ($Q_1$), the second amplifying transistor ($Q_2$) and the transistor ($Q_{22}$) are enhancement mode FET devices, while the transistor ($T_1$) is a depletion mode FET device. Thus, the control, C, of each of the transistors ($Q_1$, $Q_2$, $Q_{22}$, and $T_1$) are gates, the non-inverting outputs, N, are sources, and the inverting outputs, I, are drains. The inverting outputs, I, of the first amplifying transistor ($Q_1$) and the second amplifying transistor ($Q_2$) are not directly connected to one another since the transistor ($Q_{22}$) is connected between the first amplifying transistor ($Q_1$) and the second amplifying transistor ($Q_2$). However, the inverting outputs, I, of the first amplifying transistor ($Q_1$) and the second amplifying transistor ($Q_2$) are operably associated through the transistor ($Q_{22}$) such that the first amplifying transistor ($Q_1$) and the second amplifying transistor ($Q_2$) amplify the input signal 86 since the drain current and/or drain voltage of the first amplifying transistor ($Q_1$) are used to generate the amplified output signal 90. Consequently, the inverting outputs, I, of the first amplifying transistor ($Q_1$) and the second amplifying transistor ($Q_2$) are operably associated to amplify the input signal 86 and the gains of the amplifying transistors ($Q_1$, $Q_2$) may be compounded by the Darlington cascode topology to generate the amplified output signal 90.

Figure 10:
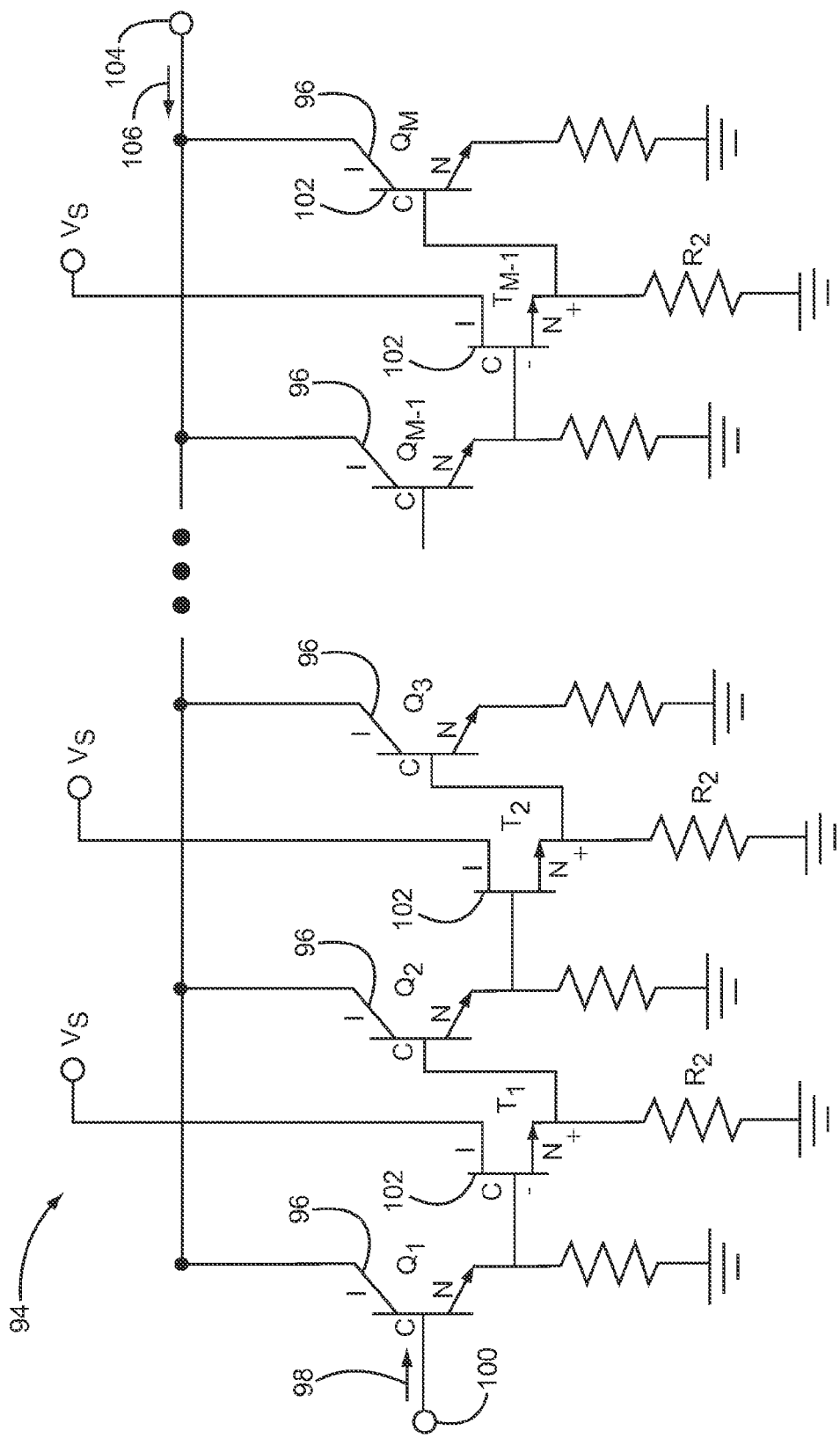
FIG. 10 illustrates a fifth embodiment of a Darlington amplifier in accordance with this disclosure.

Referring now to FIG. 10, a Darlington amplifier 94 may include any number of amplifying transistors (referred to generically as elements 96 and specifically to a specific amplifying transistor as elements, $Q_1$-$Q_M$) greater than the integer (1) to amplify an input signal 98 received at an input terminal 100. In this embodiment, the Darlington amplifier 94 has M number of amplifying transistors 96 where M may be any integer greater than one (1). A first amplifying transistor ($Q_1$) through a last amplifying transistor ($Q_M$), are configured as a chain of amplifying transistors 96, which forms the Darlington amplifier 94. Each amplifying transistor 96 includes a control, C, a non-inverting output, N, and an inverting output, I. In this case, the amplifying transistors 96 are HBTs, and thus the control, C, of each of the amplifying transistors 96 is a base, the non-inverting outputs, N, are emitters, and the inverting outputs, I, are collectors. Any number of transistors (referred to generically as elements 102 and to a specific transistor as elements $T_1$-$T_{M-1}$) may be coupled between the amplifying transistors 96. The transistors 102 shown in FIG. 10 are depletion mode FETs and thus a control, C, of each of the transistors 102 are gates, the non-inverting outputs, N, are drains, and the inverting outputs, I, are sources. The control, C, of each of the transistors ($T_1$-$T_{M-1}$) is coupled to the non-inverting output, N, of the adjacent amplifying transistor ($Q_1$-$Q_{M-1}$) closer to the beginning of the chain while the non-inverting output, N, of the transistors ($T_1$-$T_{M-1}$) are coupled to the control, C, of the adjacent amplifying transistor ($Q_2$-$Q_M$) closer to the end of the chain. The inverting outputs, I, of the amplifying transistors 96 are operably associated with one another and an output terminal 104 so that each of the amplifying transistors 96 amplifies the input signal 98 to generate an amplified output signal 106, which is transmitted from the output terminal 104. The inverting outputs, I, of each of the transistors 102 are not coupled to the inverting outputs, I of the amplifying transistors 96 or to the output terminal 104. Instead, each of the inverting outputs, I, are coupled to a supply voltage, $V_S$, so that the non-inverting output, N, is not biased by the amplified output signal 106. In this manner, the transistors 102 can lower a knee voltage of the Darlington amplifier 94, as explained above.

Those skilled in the art will recognize improvements and modifications to the preferred embodiments of the present disclosure. All such improvements and modifications are considered within the scope of the concepts disclosed herein and the claims that follow.

What is claimed is:

1. An amplifier circuit adapted to amplify an input signal, the amplifier circuit, comprising:
    a first transistor having a first control configured to receive the input signal, a first non-inverting output, and a first inverting output;
    a second transistor having a second control, a second non-inverting output, and a second inverting output, wherein the second transistor is configured to be activated by a negative voltage between the second control and the second non-inverting output so that a voltage at the second control is lower than a voltage at the second non-inverting output;
    a third transistor having a third control, a third non-inverting output, and a third inverting output, wherein:
        the third control of the third transistor is coupled to the second non-inverting output of the second transistor; and
        the third inverting output of the third transistor is operably associated with the first inverting output of the first transistor such that the first transistor and the third transistor amplify the input signal to generate an amplified output signal.

2. The amplifier circuit of claim 1 wherein:
    the first transistor is a first bipolar transistor wherein the first control is a first base, the first non-inverting output is a first emitter, and the first inverting output is a first collector;
    the second transistor is a depletion mode field effect transistor (FET) wherein the second control is a first gate, the second non-inverting output is a first source, and the second inverting output is a first drain;
    the third transistor is a second bipolar transistor wherein the third control is a second base, the third non-inverting output is a second emitter, and the third inverting output is a second collector.

3. The amplifier circuit of claim 2, wherein the first bipolar transistor is a first heterostructure bipolar transistor (HBT) and the second bipolar transistor is a second HBT.

4. The amplifier circuit of claim 2 wherein the first bipolar transistor is a first NPN type transistor and the second bipolar transistor is a second NPN type transistor.

5. The amplifier circuit of claim 2, further comprising:
    one or more semiconductor substrates, each of the first transistor, the second transistor, and the third transistor being formed on the one or more semiconductor substrates;
    wherein at least one of the one or more semiconductor substrates is a Gallium Arsenide type substrate.

6. The amplifier circuit of claim 1 wherein:
    the first transistor is an enhancement mode field effect transistor (FET) wherein the first control is a first gate, the first non-inverting output is a first source, and the first inverting output is a first drain;
    the second transistor is a depletion mode FET wherein the second control is a second gate, the second non-inverting output is a second source, and the second inverting output is a second drain;
    the third transistor is a second enhancement mode FET wherein the third control is a third gate, the third non-inverting output is a third source, and the third inverting output is a third drain.

7. The amplifier circuit of claim 6, further comprising:
    one or more semiconductor substrates, each of the first transistor, the second transistor, and the third transistor being formed on the one or more semiconductor substrates;
    wherein at least one of the one or more semiconductor substrates is a Gallium Nitride type substrate.

8. The amplifier circuit of claim 1, further comprising:
    an input terminal coupled to the first control for receiving the input signal;
    an output terminal operably associated with the first inverting output and the third inverting output to transmit the amplified output signal; and
    the second inverting output being uncoupled to the output terminal.

9. The amplifier circuit of claim 8, wherein the second inverting output is coupled to receive a supply voltage.

10. The amplifier circuit of claim 9, further comprising a supply voltage source terminal for receiving the supply voltage.

11. The amplifier circuit of claim 9, further comprising a self-biasing circuit operable to generate an operating voltage, the self-biasing circuit being connected between the input terminal and the second non-inverting output of the second transistor such that the operating voltage is applied to the input signal to set a quiescent operating voltage of the amplified output signal and a feedback output signal associated with a voltage at the second non-inverting output activates the self-biasing circuit.

12. A triplet transconductor, comprising:
    a first amplifying transistor having a first control configured to receive an input signal, a first non-inverting output, and a first inverting output;
    a second amplifying transistor having a second control, a second non-inverting output, and a second inverting output, wherein the first inverting output of the first amplifying transistor and the second inverting output of the second amplifying transistor are operably associated such that the first amplifying transistor and the second amplifying transistor amplify the input signal to generate an amplified output signal; and
    a depletion mode FET, having a first gate, a first source, and a first drain wherein the first gate of the depletion mode FET is coupled to the first non-inverting output of the first amplifying transistor, the first source of the depletion mode FET is coupled to the second control of the second amplifying transistor, and the first drain of the depletion mode FET is uncoupled to the first inverting output and the second inverting output such that a voltage at the first non-inverting output is lower than a voltage at the second control.

13. The triplet transconductor of claim 12, further comprising:
an input terminal for receiving the input signal;
an output terminal for transmitting the amplified output signal, wherein the first drain is uncoupled to the output terminal.

14. The triplet transconductor of claim 12, wherein the first drain is coupled to receive a supply voltage.

15. The triplet transconductor of claim 12, further comprising:
a self-biasing circuit operable to generate an operating voltage that sets a quiescent operating voltage of the amplified output signal, the self-biasing circuit being connected between the first control of the first amplifying transistor and the first source of the depletion mode FET such that the self-biasing circuit is responsive to a feedback output signal generated at the first source of the depletion mode FET to adjust the operating voltage.

16. The triplet transconductor of claim 12, further comprising:
one or more semiconductor substrates, each of the one or more semiconductor substrates being selected from a group consisting of a Gallium Arsenide type substrate, and a Gallium Nitride type substrate;
the first amplifying transistor, the second amplifying transistor, and the depletion mode FET being formed on the one or more semiconductor substrates.

17. An amplifier circuit for amplifying an input signal, comprising:
a Darlington amplifier having a plurality of amplifying transistors that are coupled to one another such that each of the plurality of amplifying transistors are operably associated to amplify the input signal and generate an amplified output signal, wherein the plurality of amplifying transistors comprises at least a first amplifying transistor and a second amplifying transistor; and
a first depletion mode field effect transistor (FET) connected between the first amplifying transistor and the second amplifying transistor such that activating the first depletion mode FET decreases a knee voltage associated with the Darlington amplifier.

18. The amplifier circuit of claim 17, further comprising:
wherein the plurality of amplifying transistors of the Darlington amplifier comprises the first amplifying transistor, the second amplifying transistor, and one or more additional amplifying transistors; and
one or more additional depletion mode FETs, wherein each of the one or more additional depletion mode FETs is coupled between one of the one or more additional amplifying transistors and another one of the plurality of amplifying transistors such that activating the one or more additional depletion mode FETs decreases the knee voltage associated with the Darlington amplifier.

19. The amplifier circuit of claim 18, further comprising:
an input terminal for receiving the input signal and coupled to the Darlington Amplifier;
an output terminal for transmitting the amplified output signal and coupled to the Darlington Amplifier;
each of the plurality of amplifying transistors having an inverting output wherein the inverting outputs of the plurality of amplifying transistors are operably associated with one another such that each of the plurality of amplifying transistors amplify the input signal; and
each of the depletion mode FETs having a drain wherein the drain of each of the depletion mode FETs is uncoupled to the output terminal.

20. The amplifier circuit of claim 18, further comprising:
one or more semiconductor substrates, each of the one or more semiconductor substrates being selected from a group consisting of a Gallium Arsenide type substrate, and a Gallium Nitride type substrate; and
each of the plurality of amplifying transistors and each of the depletion mode FETs being formed on the one or more semiconductor substrates.

\* \* \* \* \*